United States Patent [19]

Boucher et al.

[11] Patent Number: 4,752,918

[45] Date of Patent: Jun. 21, 1988

[54] ELECTRIO-ACOUSTIC TRANSDUCERS

[75] Inventors: Didier Boucher, Six Fours Les Plages; Bernard Tocquet, Sanary; Charles Pohlenz, Six Fours Les Pages, all of France

[73] Assignee: Etat Francais, Paris, France

[21] Appl. No.: 640,145

[22] Filed: Jun. 13, 1984

[30] Foreign Application Priority Data

Jun. 23, 1983 [FR] France ................................ 83 10365

[51] Int. Cl.[4] ...................... H01L 41/08; H04R 17/00; H04B 13/00

[52] U.S. Cl. .................................... 367/158; 367/155; 367/123; 310/337

[58] Field of Search ........................ 367/22, 48, 61, 62, 367/121, 123, 155, 158, 105, 122; 310/316, 337, 365; 181/104, 106; 73/641, 642

[56] References Cited

U.S. PATENT DOCUMENTS

| | | | |
|---|---|---|---|
| 3,564,491 | 2/1971 | Granfors et al. | 367/155 |
| 3,769,532 | 10/1973 | Cocquet et al. | 367/158 |
| 3,860,901 | 1/1975 | Ehrlich et al. | 367/159 |
| 3,890,591 | 6/1975 | Bocquillian et al. | 367/155 |
| 4,031,418 | 6/1977 | Clugel et al. | 367/158 |
| 4,151,437 | 4/1979 | Tocquet | 367/167 |
| 4,227,110 | 10/1980 | Douglas et al. | 310/316 |
| 4,373,143 | 2/1983 | Lindberg | 367/158 |
| 4,477,783 | 10/1984 | Glenn | 367/155 |
| 4,509,151 | 4/1985 | Anderson | 367/122 |
| 4,530,138 | 7/1985 | Ritter | 310/365 |

FOREIGN PATENT DOCUMENTS

| | | | |
|---|---|---|---|
| 0723471 | 3/1980 | U.S.S.R. | 367/61 |

*Primary Examiner*—Nelson Moskowitz
*Attorney, Agent, or Firm*—Parkhurst & Oliff

[57] ABSTRACT

An electro-acoustic transducer according to the invention is of the Tonpilz type comprising a stack of piezo-electric plates placed between a horn and a counter-mass, and electrodes inserted between the plates. Some of the electrodes are connected to a common excitation or output conductor through phase-shifting circuits which allow the electric voltage of a proportion of these electrodes to be dephased. A logic unit allows the phase-shifting of the electrodes to be distributed within the stack according to several different groupings in dependence upon frequency. One application of the invention is to the construction of long-range power sonars.

10 Claims, 3 Drawing Sheets

ELECTRIO-ACOUSTIC TRANSDUCERS

BACKGROUND OF THE INVENTION

The present invention relates to multifrequency electro-acoustic transducers of the "Tonpilz" type having a plurality of pass bands, and a process for the construction of such transducers. Such transducers may be sonars.

In a patent application filed previously in France under No. 82/08.321 (corresponding to U.S. patent application Ser. No. 510,177), now abandoned there has been described a process for the construction of transducers of the Tonpilz type which allows high power sonal transmitters to be obtained which can transmit in two low frequency ranges separated by a difference higher than an octave.

The transducers described in that previous application are intended to transmit in a first range of low frequency fb which corresponds to the first longitudinal mode of vibration. This is a mode of vibration which corresponds to a system of stationary waves having a single node situated towards the centre of the stack of piezo-electric ceramic plates of the transducer, an antinode situated at the horn of the transducer, the vibrational amplitude of which is thus a maximum, and an antinode situated towards the countermass of the transducer. When this transducer is used to transmit on higher frequencies, the system of stationary waves is deformed and the antinodes of the system of stationary waves come close to one another. Also, one or several antinodes become located within the stack of piezo-electric creamic plates. In this case the amplitude of vibration of the horn becomes weaker.

The ceramic plates which are situated between two antinodes are deformed in phase opposition to the ceramic plates which are situated symmetrically on both those sides of the two antinodes which lie outside the region between the two antinodes. The effects of these phase-opposed plates oppose one another, so that the output of the transducer decreases when it is used at higher frequencies.

SUMMARY OF THE INVENTION

An object of the present invention is to provide improvements in the multi-frequency transducers described in the previously mentioned French patent application.

Another object of the present invention is to improve multi-frequency transducers of the Tonpilz type so that they can be used over a wide range of low frequencies, the width of which range is higher than an octave, and still maintain a good output level.

A further object of the invention is to provide a new transducer of the Tonpilz type which is intended to equip long-range power sonars, for example transmitter sonars intended for exploring the sea to detect the presence of an obstacle or a submarine.

According to one aspect of the present invention there is provided an electro-acoustic transducer of the Tonpilz type comprising a horn, a countermass, a stack of piezo-electric elements located between said horn and said countermass, and electrodes inserted between said piezo-electric elements, said electrodes being divided into two groups comprising a first group of electrodes which are earthed, and a second group of electrodes which are connected to a common conductor for carrying one of an alternating excitation voltage and an alternating output voltage, wherein at least some of said electrodes of said second group are connected to said common conductor through the intermediary of a shifting circuit.

According to another aspect of the present invention there is provided a process for transmitting and receiving acoustic waves in a plurality of pass bands situated in a wide range of frequencies, by means of an electro-acoustic transducer of the Tonpilz type comprising a horn, a countermass, a stack of piezo-electric elements located between said horn and said countermass, and electrodes which are inserted between said piezo-electric elements and which are connected to a common conductor which carries one of alternating excitation voltage and alternating output voltage, wherein some of said electrodes are connected to said common conductor through the intermediary of shifting circuits, and said transducer is equipped with a logic unit which switches said stabilizing circuits and which distributes them into groups, the composition and the distribution of which said groups vary according to the pass bands inside said frequency range.

According to a preferred embodiment, each of the electrodes of the second group, except one, is connected to the common conductor by the intermediary of a phase shifting circuit and/or amplitude shifting circuit, and all the shifting circuits are linked to a logic unit which allows the putting out of service of all or part of said shifting circuits and the varying of the number and distribution of the shifting circuits which are in service according to the frequency band in which the transducer is to transmit or receive. This allows there to be obtained, with one single transducer, several pass bands which are distributed over a very wide range of frequencies.

Such an embodiment of the invention may permit a single power transducer to be used on several frequency bands, for example over bands centered respectively on 3.2 kHz, 7.25 kHz, 12.5 kHz and 16.5 kHz, i.e. on bands which allow more than two octaves to be covered in the range of sound frequencies. There may be obtained in each of these pass bands a very high coefficient Sv of response to the transmission, i.e. higher than 140 decibels.

An embodiment of the invention may provide a sonar antenna, for example a high power transmitter sonar, which allows long range detection over the weakest frequency band. In the case where the sonar is operating near a coast or in sea which is not very deep, it can employ transmission over a higher frequency which is less sensitive to the phenomena of reverberation. It can also change over to a higher frequency when a target has been detected in order to have a better directivity and to be less easily detected at long range.

BRIEF DESCRIPTION OF THE DRAWINGS

The following description relates to the accompanying drawings which show, by way of non-limitative example, embodiments of transducers according to the invention and the results obtained when they are in use.

DETAILED DESCRIPTION OF THE PREFERRED EMBODIMENTS

Figure 1:
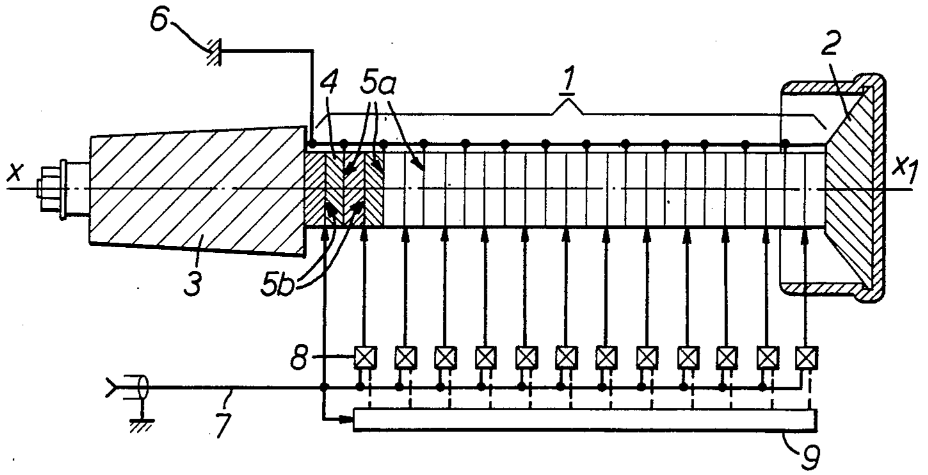
FIG. 1 is an axial section of a first embodiment of the invention.

FIG. 1 represents an axial section of a piezo-electric transducer of the Tonpilz type, along an axis x-x1. The transducer comprises a stack 1 of piezo-electric ceramic plates which is located between a horn 2 which transmits or receives the acoustic waves, and a countermass 3. The stack 1 constitutes the electro-acoustic transducer element. It comprises a plurality of piezo-electric plates 4, for example of piezo-electric ceramics, and electrodes 5 which are inserted between adjacent plates 4 and at the ends of the stack 1.

In the example shown, the electrodes 5 are divided into two groups.

A first group is that of the odd-numbered electrodes 5*a*, which are connected to earth 6. The even-numbered electrodes 5*b* are usually connected in parallel to a conductor 7 which receives an alternating voltage in the case of a transmitter, or provides an alternating voltage in the case of a hydrophone.

One of the piezo-electric axes of the plates 4 is parallel to the axis x-x1 but, as each pair of two adjacent plates lie on the two opposite sides of a common electrode, adjacent plates are orientated in the opposite direction to each other.

The transducer is for example a high power transmitter transducer, which equips a sonar antenna intended for transmitting in the sea low frequency acoustic waves, for example over frequencies comprised between 2 kHz and 20 kHz. These waves may be propagated over long distances, with a view to detecting obstacles or submarines.

The design of such a transducer is calculated by the method of finite elements, such that its first intrinsic frequency fb, in a longitudinal mode of vibration, is a very low frequency of the order of 2 to 3 kHz. One of its intrinsic frequencies, of the higher order fh, in the longitudinal mode of vibration corresponds to one of the intrinsic frequencies of deflection of the horn 2, and is of the order of three times the first frequency. The transducer can thereby transmit at a high level and with a good output in two frequency bands centered one on the low frequency fb and the other on a higher frequency fh such that fh is of the order of 3 times fb.

A method of construction of a transducer of this type is described in the aforementioned French Patent Application No. 82/08.321.

A problem to be solved is that of obtaining a good level of transmission with a transducer of this type when one passes from a low frequency to a higher frequency, and of obtaining an output which is more or less constant over a wide band of frequencies, of the order of several octaves, so that it is possible to vary at will the frequency of transmission or reception without altering substantially the performance of the sonar.

FIG. 1 represents a general embodiment in which each even electrode 5*b*, with the exception of one, is connected to the common conductor 7 through the intermediary of a stabilizing or weighting circuit 8 which is a dephase or phase-shifting circuit which can possibly be coupled to an amplitude stabilizing or shifting ciruit. It may even be possible for the circuit 8 to be an amplitude shifting circuit alone.

The circuits 8 could be 180° dephasers, of any known type, for example inductive or capacitive dephasers which allow certain electrodes to be fed in phase opposition with respect to the others. If n is the total number of even electrodes, the number m of stabilizing circuits is equal to n−1.

According to a simplified embodiment one can divide the even electrodes 5*b* into two sub-groups, a sub-group which is equipped with stabilizing circuits 8, and a sub-group which does not have any.

For example in a case where the stack comprises twenty six plates and therefore thirteen even electrodes, only half of the even electrodes forming a sub-group of associated electrodes may be connected to a 180° dephaser. For example the first seven even electrodes 1 to 7 could have no dephaser, and the final seven even electrodes 8 to 13 could have a 180° dephaser. The arrangement could also comprise a switching circuit or any other type of command circuit which would allow the dephaser or dephasers to be rendered effective or ineffective selectively to achieve the same results as those just described.

Figure 3:
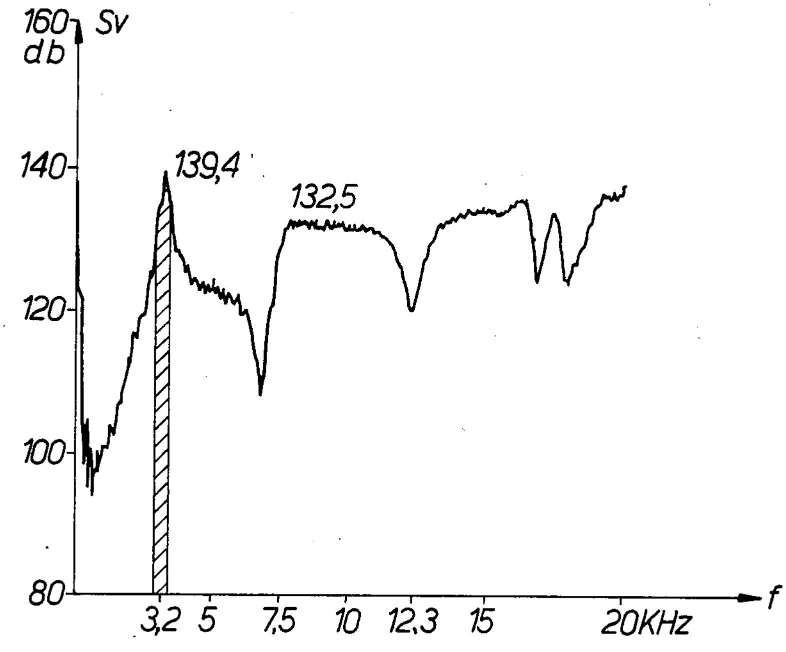
FIGS. 3 to 6 are diagrams representing the variations of the response to transmission coefficient Sv as a function of the frequency.
Figure 4:
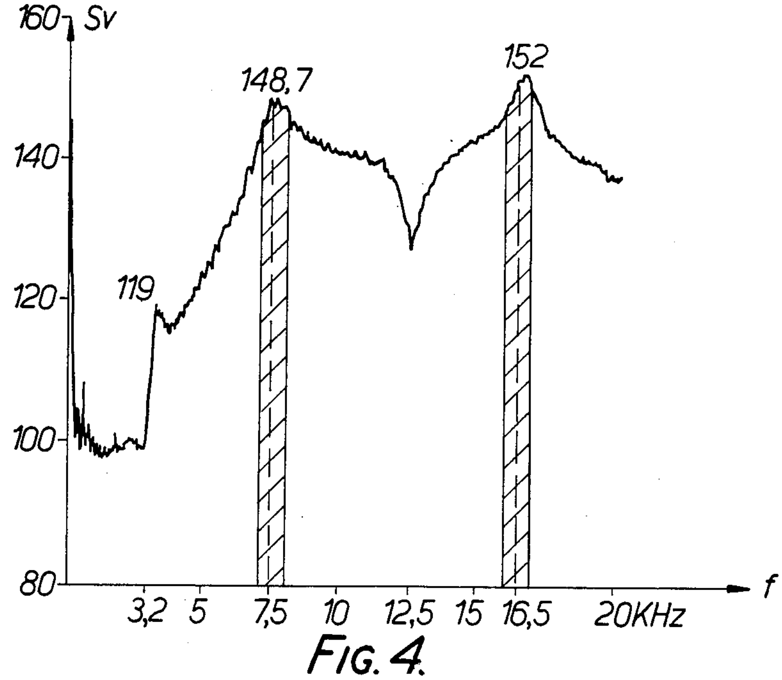

FIGS. 3 and 4 are recordings which represent on the abscissae transmission frequency in a range going from 0 to 20 kHz, and on the ordinates the coefficient Sv which is expressed in decibels and which is equal to twenty times the logarithm of the rlationship between the acoustic pressure at one meter expressed in micro pascals, and the excitation voltage expressed in volts. Sv is the coefficient of response to the transmission.

FIG. 3 represents the variation of the coefficient Sv as a function of frequency in the case where the circuits 8 are not functioning and where all the electrodes are excited in phase. It can be seen on this Figure that the transducer functions with a good level for a frequency of the order of 3.2 kHz, which is the basic frequency corresponding to the first longitudinal mode of vibration. On the other hand, it can be seen that the coefficient Sv is relatively weaker in two further frequency bands centerd on 8 kHz and on 20 kHz.

FIG. 4 represents the variation of the coefficient Sv as a function of frequency in the case where dephasers provided for the final six even electrodes 8 to 13, i.e. those closest to the horn 2, are rendered effective. On FIG. 4 it can be seen that the coefficient Sv then has two peaks, one centered on 7.5 kHz and the other on 16.5 kHz, where very high levels of the order of 150 decibels are reached.

One can therefore see that a transducer of this type can transmit with great efficiency in three distinct frequency bands, a first band centered on a frequency of 3.2 kHz without using the dephasers, and two bands centered respectively on 7.5 kHz and on 16.5 kHz using the dephasers as described, i.e. on bands which are separated by more than two octaves.

A particular embodiment has just been described in which the even electrodes are distributed into two symmetrical sub-groups with respect to the middle of the stack. Other modes of distribution into two sub-groups or more are also possible.

FIG. 1 represents a very general embodiment which comprises a logic unit 9 which is linked to all the stabilizing circuits 8 and which allows the latter to be divided into a plurality of sub-groups, made up of those which are in service and those which allow the excitation or output voltage to pass without dephasing it.

The logic unit 9 comprises switching circuits which are commanded as a function of the frequency to be transmitted or to be detected, which select the stabilizing circuits 8 which have to be in service, and which distribute them in the stack 1 differently according to the frequencies selected.

Figure 2:
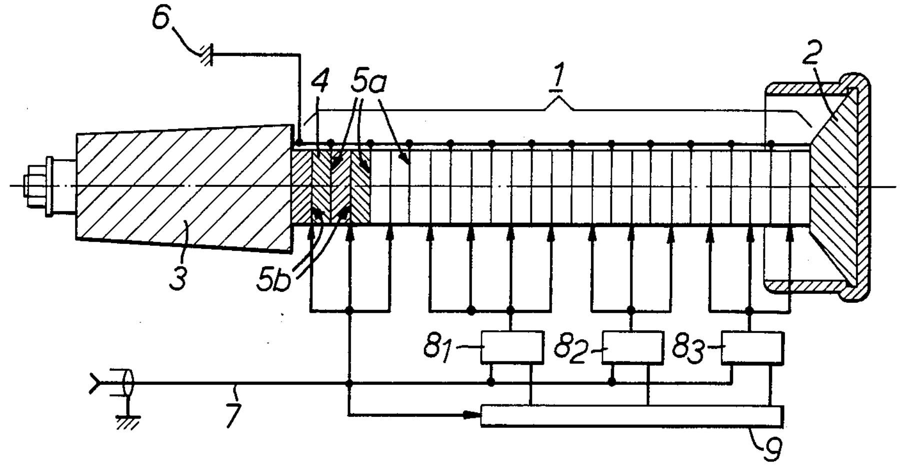
FIG. 2 is an axial section of a second embodiment of the invention.

FIG. 2 represents a simplified embodiment which allows a stabilized or shifted excitation to be obtained with groupings of electrodes which differ for three resonance frequencies corresponding to the three first longitudinal modes of vibration. Similar parts to those in FIG. 1 are represented by the same reference numerals and fulfil the same function.

The even electrodes 5b are divided into four sets of adjacent electrodes.

The first set going from the countermass 3 comprises the even electrodes Nos. 2, 4 and 6 which are connected in parallel directly to the common conductor 7.

The second set of electrodes comprises the four even electrodes Nos. 8, 10, 12 and 14 which are connected in parallel to a first stabilizing circuit $8_1$.

The third set comprises the three even electrodes Nos. 16, 18, 20 which are connected in parallel to a second stabilizing circuit $8_2$.

The fourth group of electrodes comprises the even electrodes Nos. 22, 24 and 26 which are connected in parallel to a third stabilizing circuit $8_3$.

The stabilizing circuits $8_1$, $8_2$, $8_3$ are for example 180° dephasers, or circuits which introduce both dephasing and a modification in the amplitude of the excitation or output voltage. Each stabilizing circuit is connected to the common conductor 7 and to a command logic unit 9 which comprises a frequency meter and which is programmed to command the putting into service or taking out of service of the stabilizing circuits as follows.

When it is wished to transmit or receive on the first resonance frequency, which is the low frequency fb, the three stabilizing circuits $8_1$, $8_2$, $8_3$ are put out of service and all the electrodes are therefore excited in phase.

When it is desired to transmit or receive on a second resonance frequency f1, the first stabilizing circuit $8_1$ is taken out of service whilst the second and third stabilizing circuits $8_2$ and $8_3$ are put into service. The even electrodes are therefore divided into two symmetrical sub-groups with respect to the middle of the stack: a sub-group on the side of the countermass 3 for which the excitation or output voltage is not modified; and a sub-group on the side of the horn 2 for which the excitation or output voltage is dephased. This grouping corresponds to that which was previously described, and the results for which are shown in FIG. 4.

When it is wished to transmit or receive on a third resonance frequency f2, the first and the second stabilizing circuits $8_1$ and $8_2$ are put into service and the third stabilizing circuit $8_3$ is taken out of service. The even electrodes are therefore divided into two sub-groups in the following way: a sub-group comprises the three mutually adjacent even electrodes nearest the countermass 3 and the three mutually adjacent even electrodes nearest the horn 2, for which the excitation or output voltage is not modified. Another sub-group of the even electrodes comprises all those which are inserted between the two sets of electrodes of the first-mentioned sub-group, in the central part of the stack 1, which receive or which transmit a voltage which is dephased.

Figure 5:
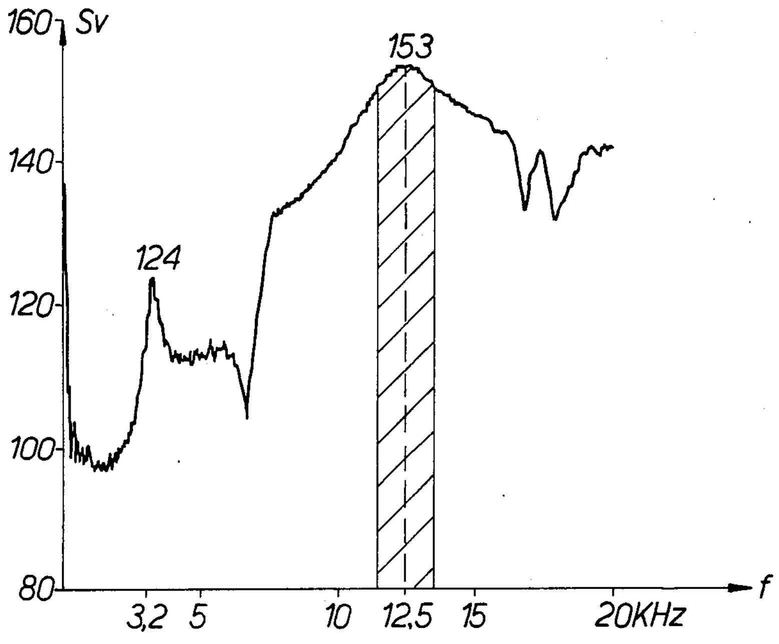

FIG. 5 represents the coefficient Sv obtained in the latter case, with the same transducer. It can be seen that this coefficient has a very marked resonance peak for a frequency of 12.5 kHz, which is between the two frequency peaks in FIG. 4.

An assembly like that in FIG. 2 therefore allows the functioning of the transducer in four different frequency bands, one low frequency band centered on a frequency of 3.2 kHz (the case in FIG. 3) by exciting all the even electrodes in parallel, two frequency bands centered on the frequencies 7.5 kHz and 16.5 kHz (the case in FIG. 4) by dividing the even electrodes into two symmetrical sub-groups with respect to the middle of the stack, and a frequency band centered on a frequency of 12.5 kHz (the case in FIG. 5) by dividing the electrodes into a central sub-group and another sub-group comprising two sets of even electrodes beyond the two respective ends of the central sub-group.

For each of the four mentioned frequency bands there is obtained a response to transmission Sv above 140 decibels, which is a high value. This example shows the possibilities of a process and embodiment according to the invention.

The examples of distribution of the sub-groups of electrodes which have been described by way of example are not limitative, and a transducer according to the invention can be equipped with a logic unit 9 which allows the distribution of the electrodes into sub-groups distributed differently.

The two simplified modes of grouping electrodes which have been described are preferred modes.

Figure 6:
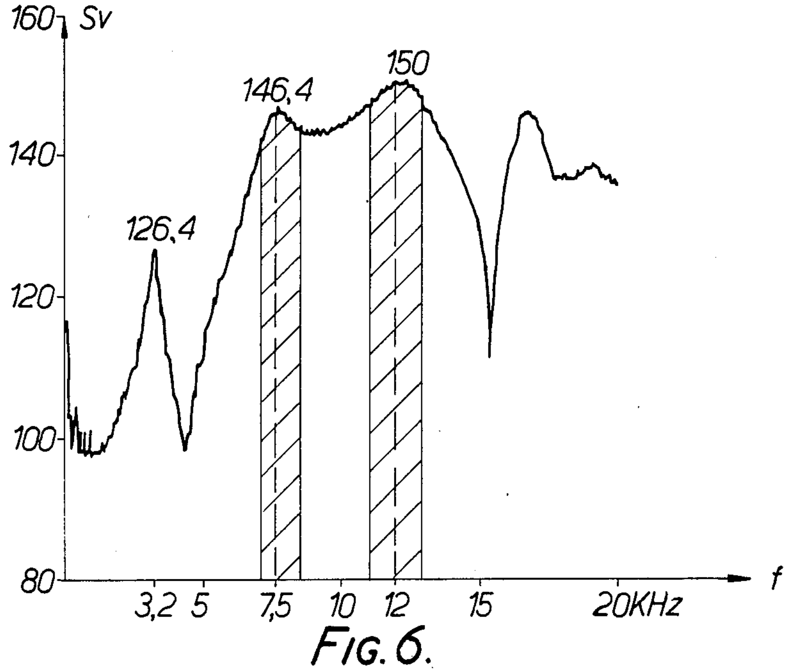

FIG. 6 represents the variations of the coefficient Sv as a function of the frequency which have also been measured with the same transducer but grouping the even electrodes in the following way: a first sub-group comprising the electrodes Nos. 2 and 20, 22, 24 and 26, and a second sub-group comprising the electrodes 4, 6, 8, 10, 12, 14, 16 and 18, the two groups being excited in phase opposition. This Figure shows that in this case there is obtained a coefficient Sv higher than 140 in two frequency bands centered on 7.5 kHz and 12 kHz.

On FIGS. 3 to 6, pass bands have been hatched which correspond to an attenuation of 3 db with respect to the maximum.

The preceding description shows that it is possible to use the same electroacoustic transducer over a plurality of frequency bands going from 3.2 kHz to 17 kHz, i.e. over a very wide range covering a plurality of octaves.

We claim:

1. An electro-acoustic transducer comprising a horn, a countermass, a stack of piezo-electric elements located between said horn and said countermass, and electrodes inserted between said piezo-electric elements, said electrodes being divided into two groups comprising a first group of electrodes which are earthed, and a second group of electrodes which are connected to a common conductor for carrying one of an alternating excitation voltage and an alternating output voltage, wherein at least some of said electrodes of said second group are connected to said common conductor through the intermediary of at least one shifting circuit, and further wherein all shifting circuits are linked to a switching logic unit which allows each shifting circuit to be put in or out of service, the number and distribution of shifting circuits which are in service being varied according to the frequency band in which said transducer is to operate, thereby providing with the same transducer a plurality of predetermined pass bands distributed over a wide range of sound frequencies at the natural modes of resonance of the transducer.

2. An electro-acoustic transducer as claimed in claim 1, wherein said electrodes of said second group can be divided by said switching logic unit into two substantially equal sub-groups: a first sub-group connected directly to said common conductor, and a second sub-group connected to said common conductor through at least one shifting circuit.

3. An electro-acoustic transducer as claimed in claim 2, wherein said electrodes of said second group can be divided by said switching logic unit into said two sub-groups which are arranged symmetrically on respective opposite sides of the middle of said stack.

4. An electro-acoustic transducer as claimed in claim 2, wherein said electrodes of said second group can be divided by said switching logic unit into said first and second sub-groups, one of which is situated centrally of the stack and the other of which is divided between the two respective end regions of said stack.

5. An electro-acoustic transducer as claimed in claim 1, wherein all but one of said electrodes of said second group are connected to said common conductor through the intermediary of at least one shifting circuit.

6. An electro-acoustic transducer as claimed in claim 2, wherein said electrodes of said second group are distributed into four substantially equal sets of adjacent electrodes, a first set of electrodes being connected directly to said common conductor, and the other three sets of electrodes being connected respectively to three shifting circuits which are themselves connected to said common conductor, said shifting circuits being connected to said switching logic unit which is operable to put out of service all said shifting circuits when the transducer is to be used in a first frequency band, to put into service the second and the third shifting circuits when the transducer is to be used in two higher frequency bands, and to put into service the first and second shifting circuits when the transducer is to be used in a further frequency band.

7. An electro-acoustic transducer as claimed in claim 6, wherein the four frequency bands are centered substantially on 3.2 kHz, 7.5 kHz, 17.5 kHz and 12.5 kHz, respectively.

8. An electro-acoustic transducer as claimed in claim 1, wherein each said shifting circuit comprises a phase shifting circuit.

9. An electro-acoustic transducer as claimed in claim 8, wherein each said phase shifting circuit is a 180° dephaser.

10. A process for transmitting and receiving acoustic waves in a plurality of pass bands situated in a wide range of frequencies at the natural modes of resonance and by means of an electro-acoustic transducer comprising a horn, a countermass, a stack of piezo-electric elements located between said horn and said countermass, and electrodes which are inserted between said piezo-electric elements and which are connected to a common conductor which carries one of alternating excitation voltage and alternating output voltage, wherein some of said electrodes are connected to said common conductor through the intermediary of shifting circuits, and further wherein said transducer is equipped with a switching logic unit which switches said shifting circuits in and out of service and which distributes them into groups, the composition and distribution of said groups being varied according to the pass bands within said frequency range.

* * * * *

UNITED STATES PATENT AND TRADEMARK OFFICE
CERTIFICATE OF CORRECTION

PATENT NO. : 4,752,918

DATED : June 21, 1988

INVENTOR(S) : Didier BOUCHER et al.

It is certified that error appears in the above-identified patent and that said Letters Patent is hereby corrected as shown below:

On The Title Page:

In the Title, Section [54], change "ELECTRIO-ACOUSTIC" to --ELECTRO-ACOUSTIC--.

Signed and Sealed this

First Day of November, 1988

*Attest:*

DONALD J. QUIGG

*Attesting Officer*

*Commissioner of Patents and Trademarks*